(12) United States Patent
Lin et al.

(10) Patent No.: US 8,637,855 B2
(45) Date of Patent: Jan. 28, 2014

(54) ORGANIC LIGHT EMITTING DEVICE AND MANUFACTURING METHOD THEREOF

(75) Inventors: Chen-Chi Lin, Hsinchu County (TW); Ting-Kuo Chang, Hsinchu (TW); Chieh-Wei Chen, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 430 days.

(21) Appl. No.: 13/023,506

(22) Filed: Feb. 8, 2011

(65) Prior Publication Data

US 2012/0104363 A1    May 3, 2012

(30) Foreign Application Priority Data

Oct. 28, 2010 (TW) .............................. 99136996 A

(51) Int. Cl.
*H01L 35/24* (2006.01)

(52) U.S. Cl.
USPC .................................. 257/40; 257/73; 257/83

(58) Field of Classification Search
USPC ............................................. 257/40, 73, 89
See application file for complete search history.

(56) References Cited

U.S. PATENT DOCUMENTS

| | | | |
|---|---|---|---|
| 6,693,296 B1 | 2/2004 | Tyan | |
| 6,861,810 B2* | 3/2005 | Rutherford | ................ 315/169.3 |
| 7,005,196 B1* | 2/2006 | Carter et al. | ................... 428/690 |
| 7,034,470 B2* | 4/2006 | Cok et al. | ....................... 315/249 |
| 7,612,499 B2* | 11/2009 | Tsujimura et al. | ............ 313/506 |
| 2004/0183067 A1 | 9/2004 | Strip | |

FOREIGN PATENT DOCUMENTS

| | | |
|---|---|---|
| CN | 101022124 | 8/2007 |
| TW | I296894 | 5/2008 |

OTHER PUBLICATIONS

"Second Office Action of China counterpart application" issued on Jul. 3, 2012, p. 1-p. 3, in which CN101022124 was cited.

* cited by examiner

*Primary Examiner* — Howard Weiss
*Assistant Examiner* — Steven Rao
(74) *Attorney, Agent, or Firm* — Jianq Chyun IP Office

(57) ABSTRACT

An organic light emitting device having a light emitting unit that includes an anode layer, a second wire, an insulating layer, first and second organic light emitting layers and a cathode layer is provided. The anode layer includes first and second sub-electrodes and a first wire connecting the first and second sub-electrodes that are arranged in a first direction. The second wire is disposed between the first and second sub-electrodes. The insulating layer is disposed on the first and second sub-electrodes and the second wire, and has a plurality of openings to expose the first sub-electrode, the second sub-electrode and the second wire. The first and second organic light emitting layers are disposed in two openings. The cathode layer is disposed on the first and second organic light emitting layers, and the cathode layer fills another opening to electrically connect to the second wire through the another opening.

15 Claims, 12 Drawing Sheets

ORGANIC LIGHT EMITTING DEVICE AND MANUFACTURING METHOD THEREOF

CROSS-REFERENCE TO RELATED APPLICATION

This application claims the priority benefit of Taiwan application serial no. 99136996, filed on Oct. 28, 2010. The entirety of the above-mentioned patent application is hereby incorporated by reference herein and made a part of this specification.

BACKGROUND

1. Field of Invention

The present invention relates to a light emitting device and a manufacturing method thereof. More particularly, the present invention relates to an organic light emitting device and a manufacturing method thereof.

2. Description of Related Art

An organic light emitting device offers a variety of desirable features, such as a thin-body implementation, self-emissive property, low power consumption, no backlight source, a wide viewing angle, and a high reaction rate, etc. Thus, in recent years, an organic light emitting device has become the mainstream of flat screen displays. Moreover, a passive organic light emitting device may be formed as an array structure on a light and thin, flexible substrate. Hence, an organic light emitting device is also suitable for illumination purposes. Typically, the light emitting efficiency of an organic light emitting device is estimated to increase to 100 Lm/W or higher, and the color rendering index is higher than 80. Accordingly, an organic light emitting device has a potential to replace a typical illumination light source and to serve an important role in illumination apparatuses.

In an organic light emitting device that has a large area, since such a device is driven by current, the trace impedance may induce non-uniform brightness in the light emitting region. Hence, an organic light emitting device having a large area is normally divided into a plurality of small-area light emitting units. Moreover, the laterally extended light emitting units are serially connected, while the serially connected light emitting units are also connected in parallel. In other words, a bridge circuit is disposed between two neighboring light emitting units to provide uniform brightness in the light emitting region. However, the disposition of the above bridge circuit will lower the overall aperture ratio of the organic light emitting device.

SUMMARY OF THE DISCLOSURE

The present invention relates to an organic light emitting device, wherein the organic light device provides a uniform brightness and has a desirable aperture ratio.

The present invention relates a manufacturing method of an organic light emitting device, wherein the organic light emitting device manufactured according to the method provides a uniform brightness and has a desirable aperture ratio.

An exemplary embodiment of the invention provides an organic light emitting device, the device includes a substrate and a first light emitting unit. The first light emitting unit includes a first anode layer, a second conductive line, a first insulation layer, a first organic light emitting layer, a second organic light emitting layer and a first cathode layer. The first anode layer is disposed on the substrate, and the first anode layer includes a first sub-electrode, a second sub-electrode and a first conductive line connecting the first sub-electrode and the second sub-electrode, wherein the first sub-electrode and the second sub-electrode are substantially arranged along a first direction. The second conductive line is also disposed on the substrate between the first sub-electrode and the second sub-electrode. The first insulation layer, disposed on the first sub-electrode, the second sub-electrode and the second conductive line, has a first opening, a second opening, and a third opening respectively exposing the first sub-electrode, the second sub-electrode and the second conductive line. The first organic light emitting layer is disposed in the first opening. The second organic light emitting layer is disposed in the second opening. The first cathode layer is disposed on the first organic light emitting layer and the second organic light emitting layer and fills the third opening, wherein the first cathode layer is electrically connected with the second conductive line via the third opening.

According to an exemplary embodiment of the invention, the longitudinal axis of the first cathode layer extends substantially along the first direction.

According to an exemplary embodiment of the invention, the first sub-electrode and the second sub-electrode are constructed with a same material.

According to an exemplary embodiment of the invention, the first conductive line and the second conductive line are constructed with a same material.

According to an exemplary embodiment of the invention, the organic light emitting device further includes a second light emitting unit, and the second light emitting unit and the first light emitting unit are substantially arranged along a second direction, wherein the second light emitting unit includes a second anode layer disposed on the substrate, and the second anode layer and the second conductive line are electrically connected, such that the second anode layer of the second light emitting unit and the first cathode layer of the first light emitting unit are electrically connected through the second conductive line; hence, the second light emitting unit and the first light emitting unit are coupled in series along the second direction.

According to an exemplary embodiment of the invention, the above second anode layer includes a third sub-electrode, a fourth sub-electrode and a third conductive line connecting the third sub-electrode and the fourth sub-electrode, and the third sub-electrode and the fourth sub-electrode are substantially arranged along the first direction.

According to an exemplary embodiment of the invention, the above second conductive line and the third conductive line are electrically connected.

According to the exemplary embodiment of the invention discussed above, the above second light emitting unit further includes a fourth conductive line, a second insulation layer, a third organic light emitting layer, a fourth organic light emitting layer, and a second cathode layer. The fourth conductive line is disposed on the substrate between the third sub-electrode and the fourth sub-electrode. The second insulation layer, disposed on the third sub-electrode, the fourth sub-electrode and the fourth conductive line, has a fourth opening, a fifth opening and a sixth opening respectively exposing the third sub-electrode, the fourth sub-electrode and the fourth conductive line. The third organic light emitting layer is disposed in the fourth opening. The fourth organic light emitting layer is disposed in the fifth opening. The second cathode layer is disposed on the third and fourth organic light emitting layers, and fills the sixth opening, wherein the second cathode layer is electrically connected with the fourth conductive line through the sixth opening.

According to an exemplary embodiment of the invention, there is a gap between the first sub-electrode and the third sub-electrode. The first organic light emitting layer and the third organic light emitting layer are structurally connected, and cover the first sub-electrode, the third sub-electrode and the gap, and the first and third organic light emitting layers are substantially configured along the second direction.

According to an exemplary embodiment of the invention, there is a gap between the above second sub-electrode and the fourth sub-electrode The second and fourth organic light emitting layers are structurally connected, and cover the second sub-electrode, the fourth sub-electrode and the gap, and the second and fourth organic light emitting layers are substantially configured along the second direction.

According to an exemplary embodiment of the invention, the longitudinal axis of the second cathode layer substantially extends along the first direction.

According to an exemplary embodiment of the invention, the light emitting device further includes a third light emitting unit, and the third light emitting unit and the first light emitting unit are substantially arranged along the first direction, wherein the third light emitting unit includes a third cathode layer disposed on the substrate, and the third cathode layer and the first cathode layer of the first light emitting unit are electrically connected, such that the first light emitting unit and the third light emitting unit are coupled in parallel along the first direction.

According to an exemplary embodiment of the invention, the first cathode layer and the third cathode layer are structurally connected and are substantially configured along the first direction.

The invention provides a manufacturing method of an organic light emitting device. A first patterned conductive layer is formed on a substrate, and the first patterned conductive layer includes a first conductive line, a second conductive line, a third conductive line and a fourth conductive line, wherein the second conductive line and the third conductive line are electrically connected. A second patterned conductive layer is formed on the substrate, and the second patterned conductive layer includes a first sub-electrode, a second sub-electrode, a third sub-electrode, and a fourth sub-electrode, wherein the first sub-electrode and the second sub-electrode are substantially arranged along a first direction, the third sub-electrode and the fourth sub-electrode are substantially arranged along the first direction, the first sub-electrode and the third sub-electrode are substantially arranged along a second direction, and the second sub-electrode and the fourth sub-electrode are substantially arranged along the second direction. The first conductive line electrically connects the first sub-electrode and the second sub-electrode. The second conductive line is disposed between the first sub-electrode and the second sub-electrode. The third conductive line electrically connects the third sub-electrode and the fourth sub-electrode, and the fourth conductive line is disposed between the third electrode and the fourth sub-electrode. The first sub-electrode, the second sub-electrode and the first conductive line form a first anode layer, and the third sub-electrode, the fourth sub-electrode and the third conductive line forms a second anode layer. An insulation layer is formed on the substrate, and the insulation layer has a first opening, a second opening and a third opening respectively exposing the first sub-electrode, the second sub-electrode and the second conductive line. The insulation layer also has a fourth opening, a fifth opening and a sixth opening respectively exposing the third sub-electrode, the fourth sub-electrode and the fourth conductive line. A first patterned organic light emitting layer and a second patterned organic light emitting layer are formed on the insulation layer, wherein the first patterned organic light emitting layer fills the first opening and the fourth opening, and the second patterned organic light emitting layer fills the second opening and the fifth opening. A first patterned cathode layer and a second patterned cathode layer are formed on the first patterned organic light emitting layer and the second patterned organic light emitting layer, wherein the first patterned cathode layer is disposed on the first sub-electrode and the second sub-electrode, while fills the third opening, and the second patterned cathode layer is disposed on the third sub-electrode and the fourth sub-electrode, and fills the sixth opening. The first patterned cathode layer is electrically connected with the second conductive line through the third opening, and the second patterned cathode layer is electrically connected with the fourth conductive line through the sixth opening.

According to an exemplary embodiment of the invention, the longitudinal axis of the first patterned organic light emitting layer and the longitudinal axis of the second patterned organic light emitting layer substantially extend along the second direction, and the first patterned organic light emitting layer and the second patterned light emitting layer are substantially arranged along the first direction.

According to an exemplary embodiment of the invention, the longitudinal axis of the first patterned cathode layer and the longitudinal axis of the second patterned cathode layer substantially extend along the first direction, and the first patterned cathode layer and the second cathode layer are substantially arranged along the second direction. Further, the first patterned cathode layer crosses over the first patterned organic light emitting layer and the second patterned organic light emitting layer, and the second patterned cathode layer crosses over the first patterned organic light emitting layer and the second patterned organic light emitting layer.

According to the organic light emitting device and a manufacturing method thereof of the exemplary embodiments of the invention, the disposition of and the connection between the light emitting units allows the organic light emitting device to have a uniform brightness and a preferred aperture ratio.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
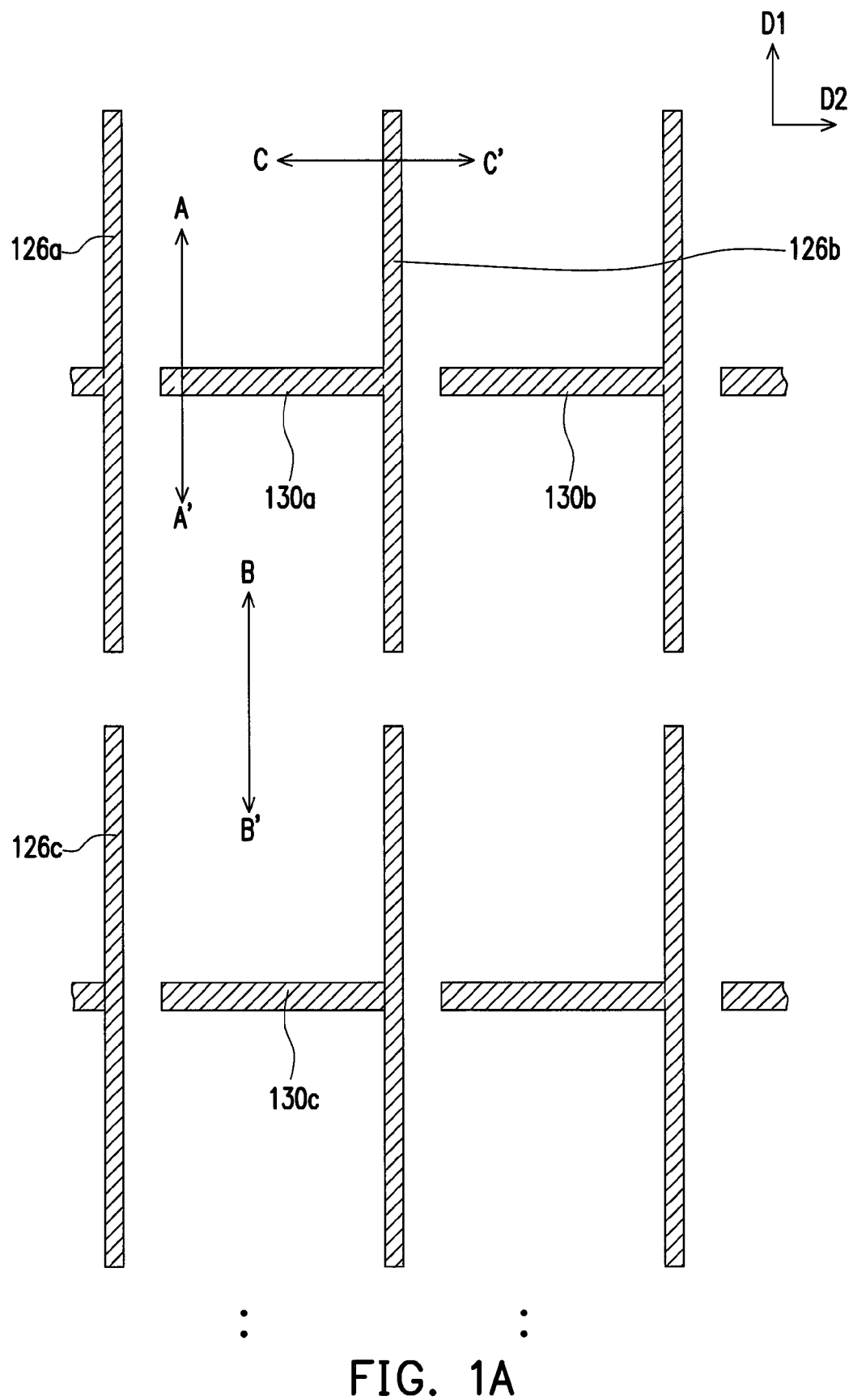
FIGS. 1A to 1D are schematic top view diagrams illustrating exemplary process steps of the manufacturing method for an organic light emitting device according to an exemplary embodiment of the invention.

FIGS. 1A to 1D are schematic top view diagrams illustrating exemplary process steps of the manufacturing method for an organic light emitting device according to an exemplary embodiment of the invention. FIGS. 2A to 2D are cross-sectional view diagrams of FIGS. 1A to 1D along the cutting lines A-A', B-B', C-C', wherein in FIGS. 1A to 1D, the illustration of a substrate 100 and an insulation layer 140 is omitted. Referring concurrently to FIGS. 1A and 2A, a first patterned conductive layer 210 is formed on a substrate 100, wherein the first patterned conductive layer 210 includes a plurality of first conductive lines 126a, 126b, 126c and a plurality of second conductive lines 130a, 130b, 130c, wherein the second conductive line 130a and the first conductive line 126b are electrically connected.

Figure 1B:
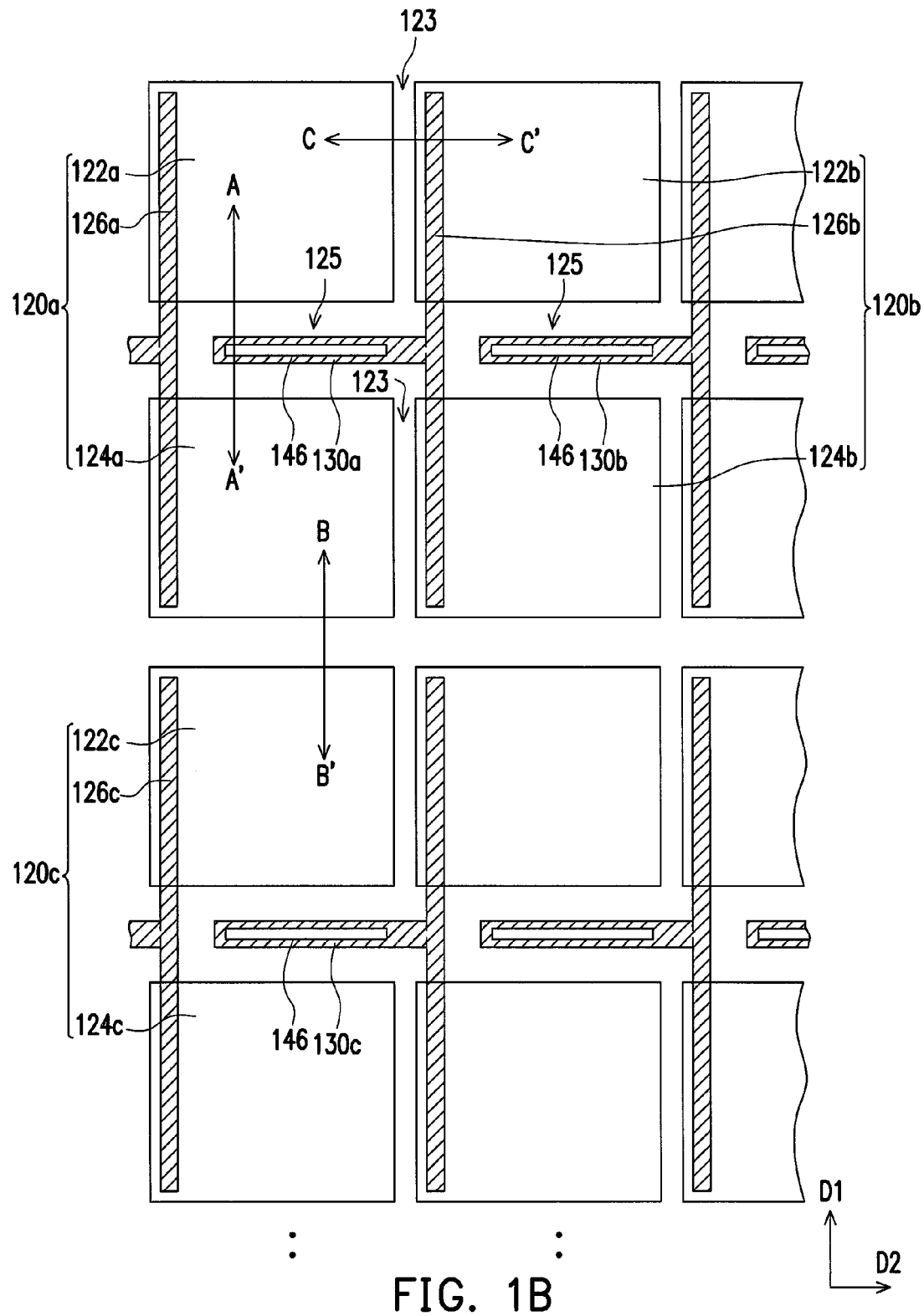
Figure 2A:
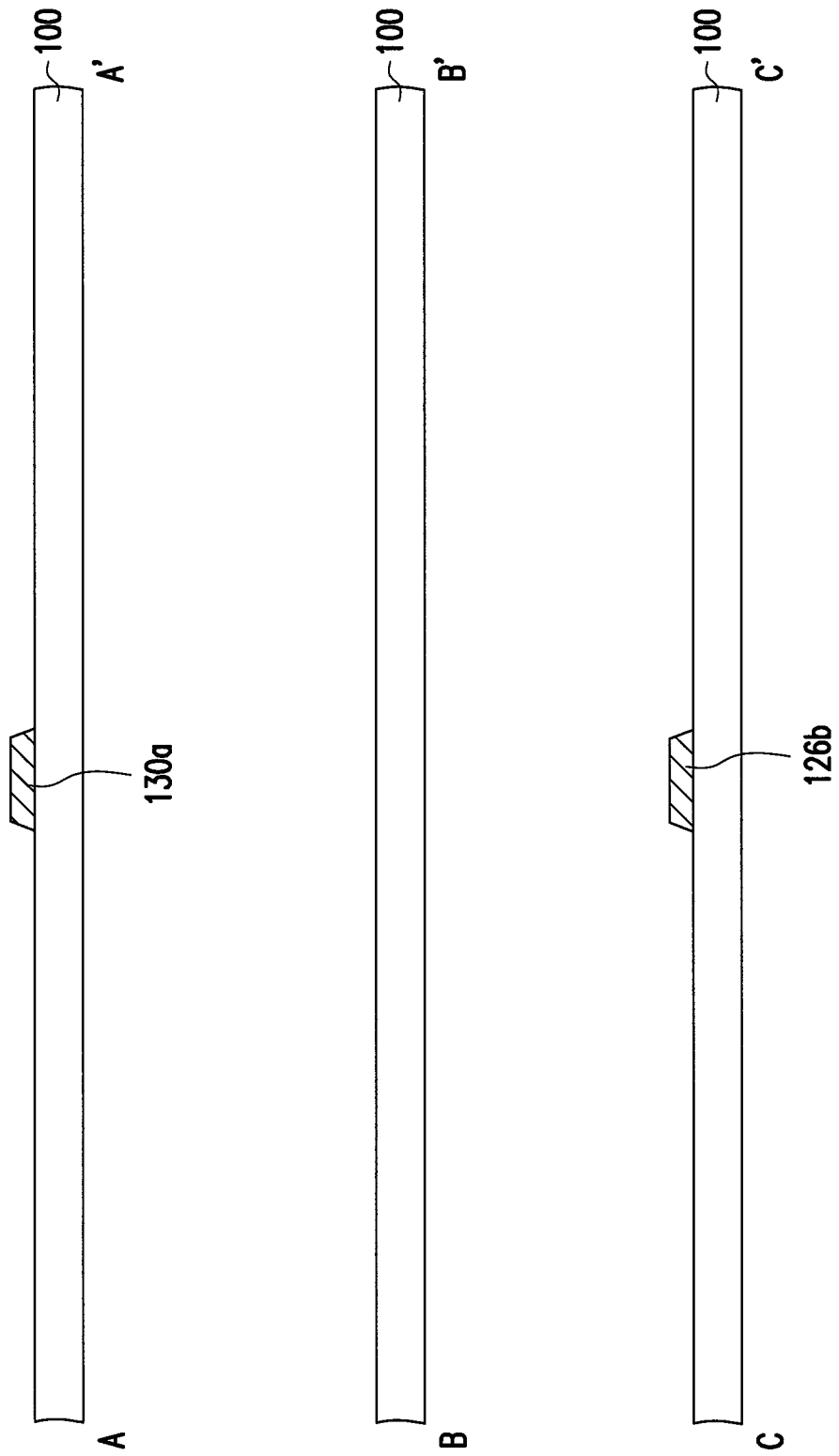
FIGS. 2A to 2D are cross-sectional view diagrams of FIGS. 1A to 1D along the cutting lines A-A', B-B', C-C'.
Figure 2B:
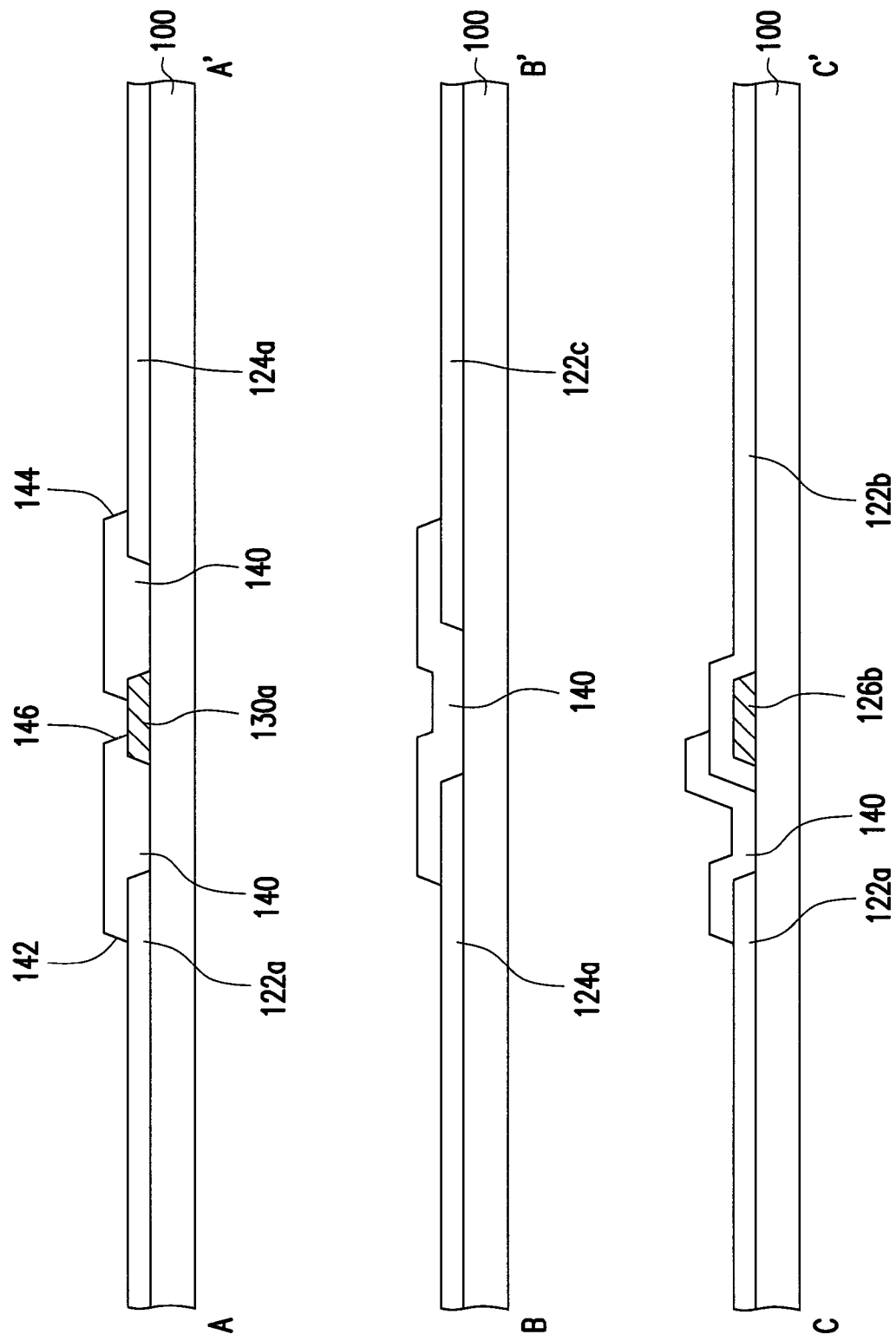

Referring concurrently to FIGS. 1B and 2B, a second patterned conductive layer 220 is formed on the substrate, and the second patterned conductive layer 220 includes a plurality of first sub-electrodes 122a, 122b, 122c and a plurality of second sub-electrodes 124a, 124b, 124c, wherein the first sub-electrodes 122a and the second sub-electrodes 124a are substantially arranged along a first direction D1, the first sub-electrodes 122b and the second sub-electrodes 124b are substantially arranged along a first direction D1, and the first sub-electrodes 122c and the second sub-electrodes 124c are substantially arranged along a first direction D1. Further, the first sub-electrodes 122a, 122b are substantially arranged along a second direction D2, and the second sub-electrodes 124a, 124b are substantially arranged along the second direction D2. The first conductive line 126a electrically connects the first sub-electrode 122a and the second sub-electrode 124a, and the second conductive line 130a is positioned between the first sub-electrode 122a and the second sub-electrode 124a. The first conductive line 126b electrically connects the first sub-electrode 122b and the second sub-electrode 124b, and the second conductive line 130b is positioned between the first sub-electrode 122b and the second sub-electrode 124b. The first conductive line 126c electrically connects the first sub-electrode 122c and the second sub-electrode 124c, and the second conductive line 130c is positioned between the first sub-electrode 122c and the second sub-electrode 124c. In this exemplary embodiment, the second conductive lines 130a, 130b, 130c, for example, are respectively disposed at the gaps 125 between the first sub-electrodes 122a, 122b, 122c and the second sub-electrodes 124a, 124b, 124c. In this exemplary embodiment, the first sub-electrode 122a, the second sub-electrode 124a and the first conductive line 126a constitute the anode layer 120a; the first sub-electrode 122b, the second sub-electrode 124b and the first conductive lines 126b constitute the anode layer 120b; first sub-electrode 122c, the second sub-electrode 124c, and the first conductive line 126c constitute the anode layer 120c.

Thereafter, an insulation layer 140 is formed on the substrate 100, and the insulation layer 140 includes a plurality of first openings 142 respectively exposing the first sub-electrodes 122a, 122b, 122c, a plurality of second openings 144 respectively exposing the second sub-electrodes 124a, 124b, 124c, and a plurality of third openings 146 respectively exposing the second conductive lines 130a, 130b, 130c.

Figure 1C:
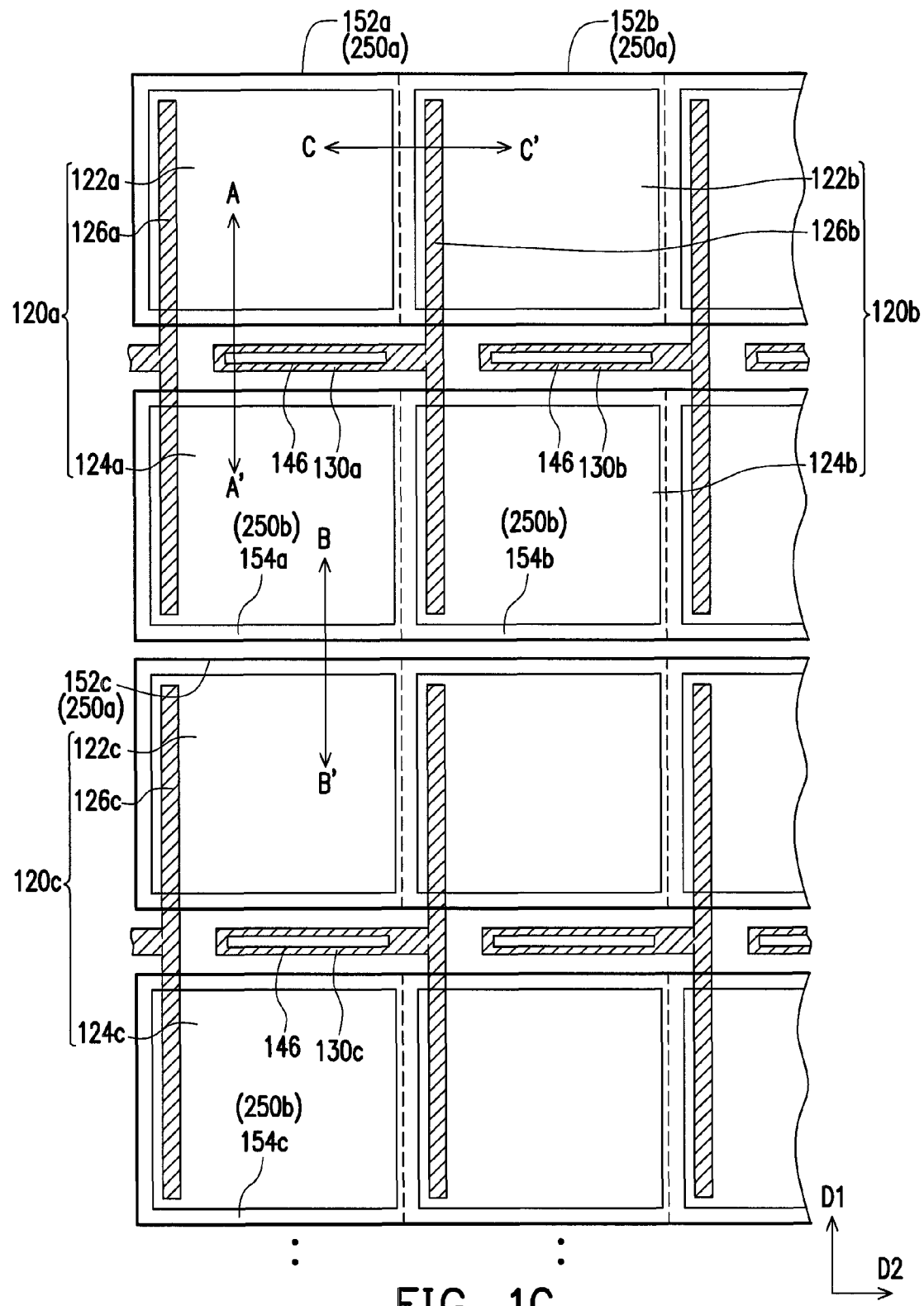
Figure 2C:
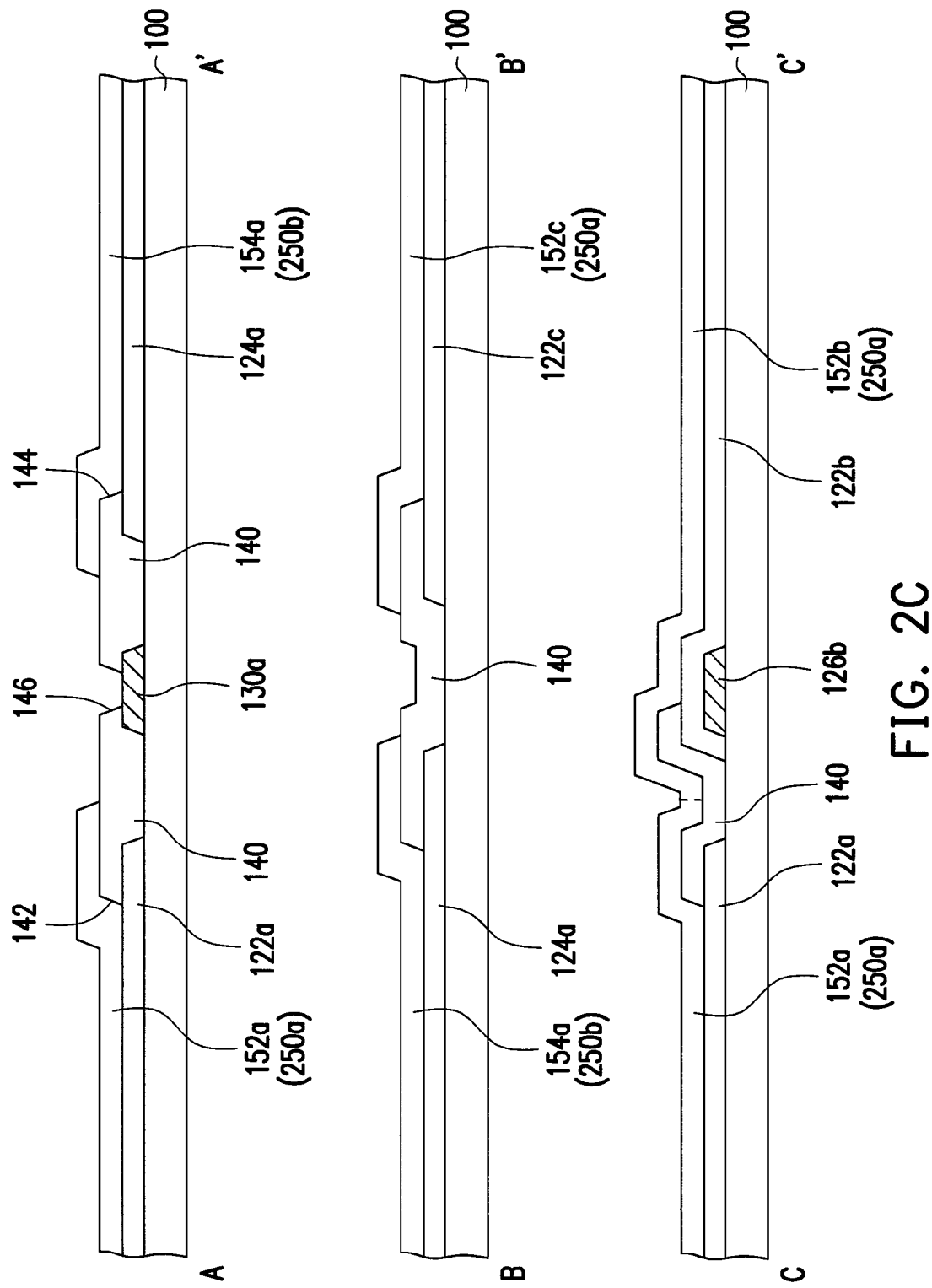

Referring concurrently to FIGS. 1C and 2C, a first patterned organic light emitting layer 250a and a second patterned organic light emitting layer 250b are then formed on the insulation layer 140, wherein the first patterned organic light emitting layer 250a is disposed on the plurality of first sub-electrodes 122a, 122b of the same row, and fills the plurality of first openings 142, and the second patterned organic light emitting layer 250b is disposed on the plurality of sub-electrodes 124a, 124b of the same row, and fills the plurality of second openings 144. In this exemplary embodiment, the first patterned organic light emitting layer 250a and the second patterned organic light emitting layer 250b are formed by an evaporation process using a mask. Moreover, the longitudinal axis of the first patterned organic light emitting layer 250a and the longitudinal axis of the second organic light emitting layer 250b, for example, substantially extend along the second direction D2, and the first patterned organic light emitting layer 250a and the second patterned organic light emitting layer 250b are substantially configured alternately in the first direction D1. In this exemplary embodiment, the first patterned organic light emitting layer 250a includes a plurality of first organic light emitting layers 152a, 152b (partitioned by dotted line) arranged in the same row along the second direction D2, and the second patterned organic light emitting layer 250b includes a plurality of second organic light emitting layers 154a, 154b (partitioned by dotted lines) arranged in the same row along the second direction D2. Moreover, another first patterned organic light emitting layer 250a includes a plurality of first organic light emitting layers 152c arranged in the same row along the second direction D2, and another second patterned light emitting layer 250b includes a plurality of second organic light emitting layers 154c arranged in the same row along the second direction D2.

Figure 1D:
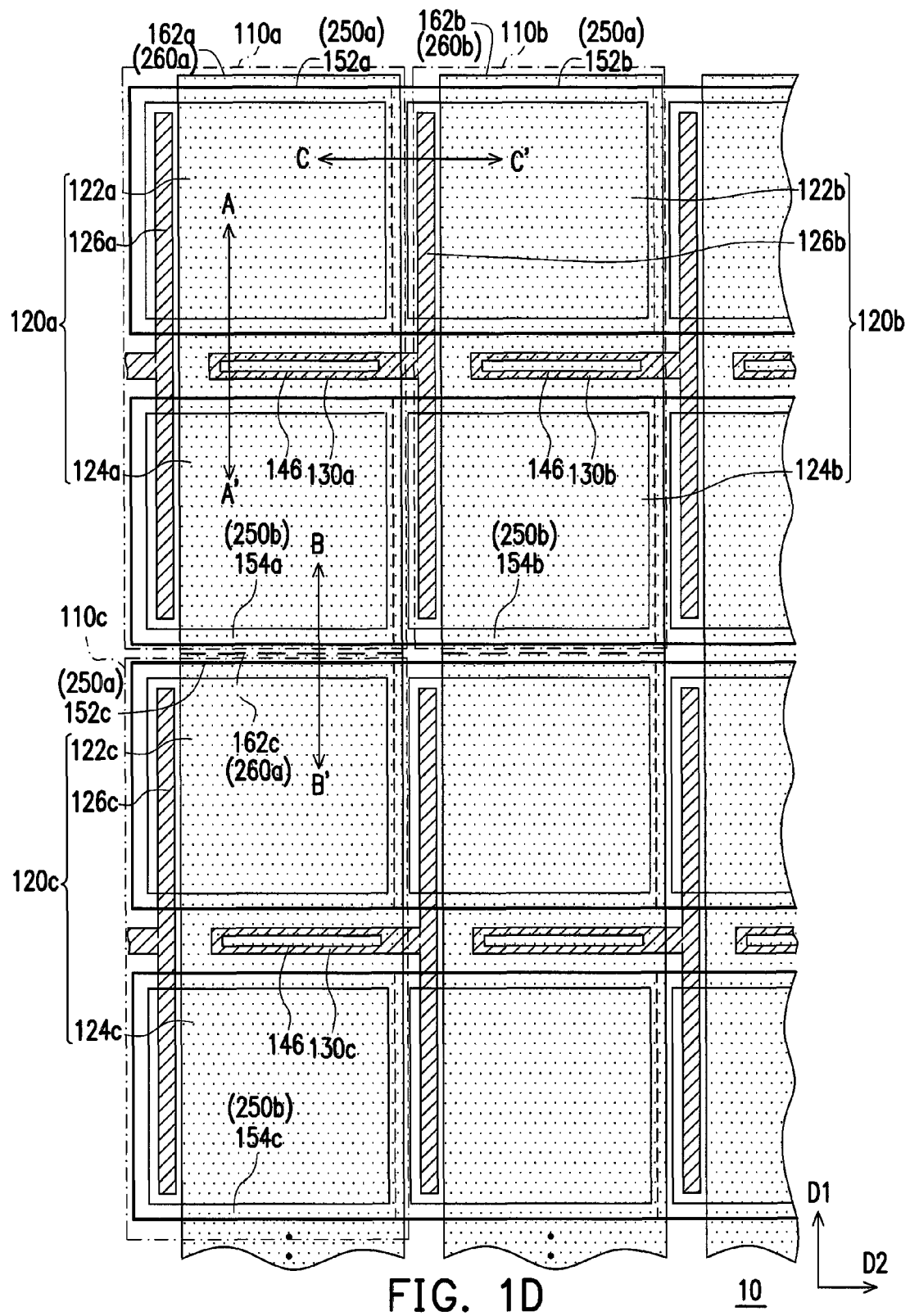
Figure 2D:
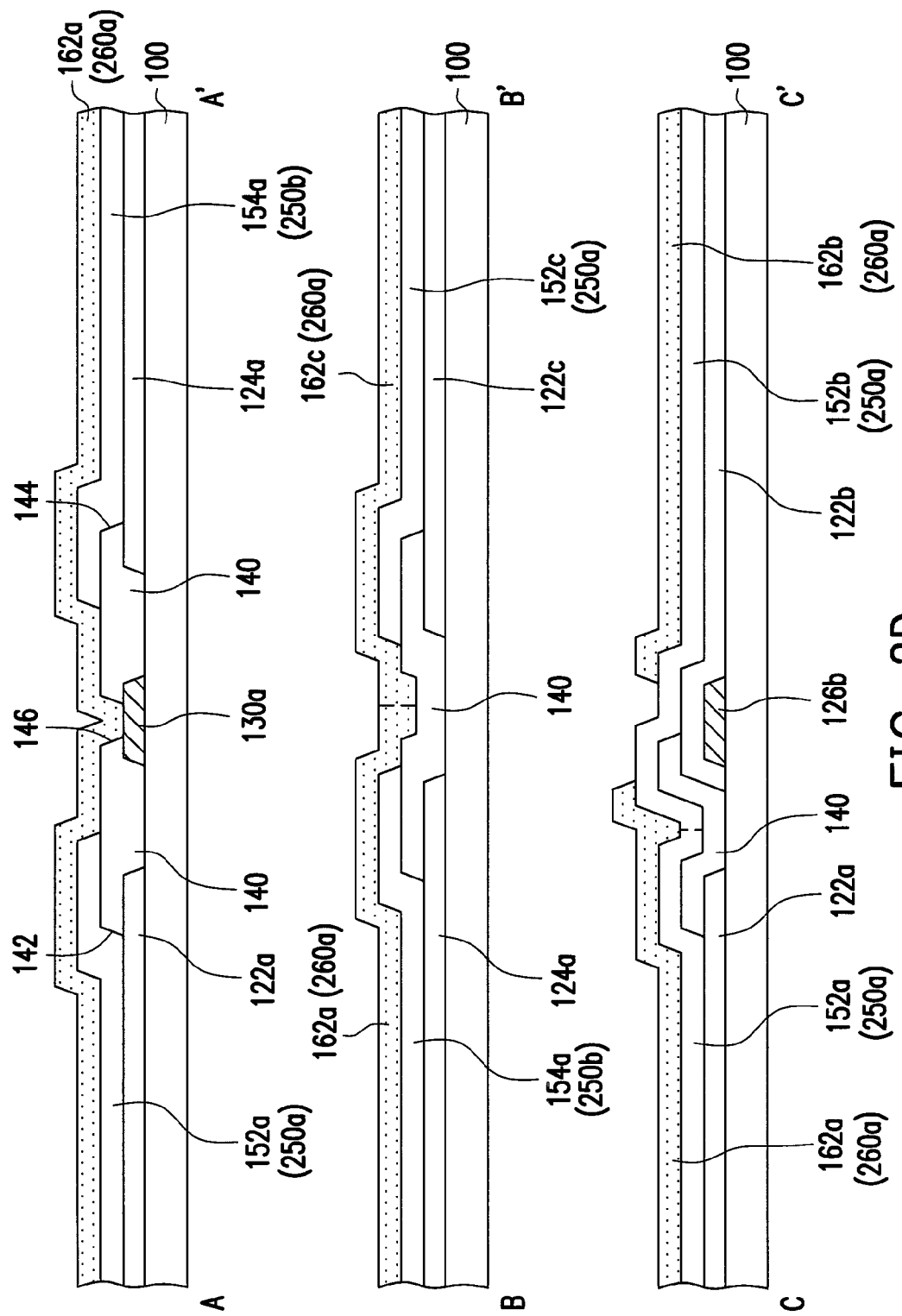

Referring to FIGS. 1D and 2D concurrently, a plurality of patterned cathode layers 260a, 260b is formed on the first patterned organic layer 250a and the second patterned organic layer 250b, wherein the first patterned cathode layer 260a is disposed on the first sub-electrode 122a and the second sub-electrodes 124a, and fills the third openings 146; and the first patterned cathode layer 260b is disposed on first sub-electrode 122b and the second sub-electrode 124b, and fills the third openings 146. Moreover, in this exemplary embodiment, the first patterned cathode layer 260a is disposed on the first sub-electrode 122c and the second sub-electrodes 124c, and fills the third openings 146 disposed between the first sub-electrode 122c and the second sub-electrodes 124c. Further, the patterned cathode layer 260a is electrically connected with the second conductive line 130a through the third opening 146, and is electrically connected with the anode layer 120b through the second conductive line 130a and the first conductive line 126b. In this exemplary embodiment of the disclosure, the patterned cathode layers 260a, 260b are formed by an evaporator process using a mask. Moreover, the patterned cathode layers 260a, 260b, for example, are substantially disposed successively in the D2 direction and the longitudinal axis of each of the patterned cathode layers 260a, 260b substantially extends along the D1 direction. Further, the patterned cathode layers 260a, 260b cross over and vertically intersect with the first patterned organic light emitting layer 250a and the second patterned organic light emitting layer 250b. In this exemplary embodiment, the patterned cathode layer 260a includes a plurality of cathode electrode layers 162a, 162c (respectively partitioned by dotted lines) of a same column arranged in the first direction D1, and the patterned electrode layer 260b includes a plurality of cathode electrode layers 162*b* (respectively partitioned by dotted lines) of a same column arranged in the first direction D1.

According to FIGS. 1D and 2D, after forming the patterned cathode electrode layers 260*a*, 260*b*, the fabrication of the light emitting device 10 is substantially completed. In other words, according to this exemplary embodiment of the disclosure, the organic light emitting device 10 includes the substrate 100 and the plurality of light emitting devices 110*a*, 110*b*, 110*c* disposed on the substrate 100. Further, the first light emitting device 110*a* and the second light emitting device 110*b* are arranged along the second direction D2 and are coupled in series, and the first light emitting unit 110*a* and the third light emitting unit 110*c*, for example, are arranged along the first direction D1 and are coupled together in parallel, wherein the first direction D1 is substantially perpendicular to the second direction D2. Alternatively speaking, the plurality of light emitting units 110*a*, 110*b*, 110*c*, etc. are arranged in an array on the substrate 100.

The light emitting unit 110*a* includes the anode layer 120*a*, the second conductive line 130*a*, the insulation layer 140, the first organic light emitting layer 152*a*, the second organic light emitting layer 154*a* and the cathode layer 162*a*. The light emitting unit 110*b* includes the anode layer 120*b*, the second conductive line 130*b*, the insulation layer 140, the first organic light emitting layer 152*b*, the second organic light emitting layer 154*b* and the cathode layer 162*b*. Similarly, the light emitting unit 110*c* includes the anode layer 120*c*, the second conductive line 130*c*, the insulation layer 140, the first organic light emitting layer 152*c*, the second organic light emitting layer 154*c* and the cathode layer 162*c*.

The anode layers 120*a*, 120*b*, 120*c* are respectively disposed on the substrate 100. The anode layer 120*a* includes the first sub-electrode 122*a*, the second sub-electrode 124*a*, and the first conductive line 126*a* electrically connecting the first sub-electrode 122*a* and the second sub-electrode 124*a*, wherein the first sub-electrode 122*a* and the second sub-electrode 124*a* are substantially arranged along the first direction D1. The anode layer 120*b* includes the first sub-electrode 122*b*, the second sub-electrode 124*b*, and the first conductive line 126*b* electrically connecting the first sub-electrode 122*b* and the second sub-electrode 124*b*, wherein the first sub-electrode 122*b* and the second sub-electrode 124*b* are substantially arranged along the first direction D1. The anode layer 120*c* includes the first sub-electrode 122*c*, the second sub-electrode 124*c*, and the first conductive line 126*c* electrically connecting the first sub-electrode 122*c* and the second sub-electrode 124*c*, wherein the first sub-electrode 122*c* and the second sub-electrode 124*c* are substantially arranged along the first direction D1. The first sub-electrodes 122*a*, 122*b*, 122*c* and the second sub-electrodes 124*a*, 124*b*, 124*c* are constituted with a transparent electrode material, such as metal oxide, which includes but not limited to, indium tin oxide, indium zinc oxide, aluminum tin oxide, aluminum zinc oxide, indium germanium zinc oxide, or other appropriate metal oxides, or a stacked layer of the above at least two metal oxide materials, or a thin metal layer or a thin metal stacked layer having high light transmittance. According to other varying exemplary embodiments, the material of the first electrodes 122*a*, 122*b*, 122*c* and the second electrodes 124*a*, 124*b*, 124*c* could be an opaque electrode layer material. The first conductive lines 126*a*, 126*b*, 126*c* may form with a metal material, such as, copper, aluminum, silver, gold, titanium, molybdenum, tungsten, chromium, or an alloy thereof or a stacked layer thereof. It should be appreciated that the examples above are not intended to restrict the scope of this invention, and this invention covers any variations of the examples provided they fall within the principles of this invention. Accordingly to other exemplary embodiments, the first conductive lines 126*a*, 126*b*, 126*c* may constitute with other conductive materials, such as alloy, a metal nitride material, a metal oxide material, a metal nitride oxide material, or other appropriate materials, or other metal materials and other stacked layer of conductive materials.

The insulation layer 140 is disposed on the first sub-electrodes 122*a*, 122*b*, 122*c*, the second sub-electrodes 124*a*, 124*b*, 124*c* and the second conductive lines 130*a*, 130*b*, 130*c*, and includes a plurality of first openings 142 respectively exposing the first sub-electrodes 122*a*, 122*b*, 122*c*, a plurality of second openings 144 respectively exposing the second sub-electrodes 124*a*, 124*b*, 124*c*, and a plurality of third openings 146 respectively exposing the second conductive lines 130*a*, 130*b*, 130*c*.

The first organic light emitting layers 152*a*, 152*b*, 152*c* are disposed in the first openings 142. The second organic light emitting layers 154*a*, 154*b*, 154*c* are disposed in the second openings 144. In an exemplary embodiment of the disclosure, the first organic light emitting layers 152*a*, 152*b*, 152*c* and the second organic light emitting layers 154*a*, 154*b*, 154*c* may constitute with the same material. The first organic light emitting layers 152*a*, 152*b*, 152*c* and the second organic light emitting layers 154*a*, 154*b*, 154*c* may be a single layer of light emitting layer or a light emitting layer in combination of an electron transport layer, an electron injection layer, a hole transport layer, or a hole injection layer. The above light emitting layer is, for example, a white light emitting layer or other specific color (for example, red, green, blue, etc.) light emitting layer. Further, at least one of the electron transport layer, the electron injection layer, the hole transport layer, and the hole injection layer is paired with the light emitting layer to form a two-layered, three-layered, four-layered, or five-layered stacked layer to enhance the light emitting efficiency of the first organic light emitting layers 152*a*, 152*b*, 152*c* and the second organic light emitting layers 154*a*, 154*b*, 154*c*. The materials and structures of the first organic light emitting layers 152*a*, 152*b*, 152*c* and the second organic light emitting layers 154*a*, 154*b*, 154*c* are known to one skilled and the art and therefore will not be repeated herein.

The cathode layers 162*a*, 162*b*, 162*c* are respectively disposed on the first organic layers 152*a*, 152*b*, 152*c* and on the second organic layers 154*a*, 154*b*, 154*c*, and respectively fill the third openings 146, wherein the cathode layers 162*a*, 162*b*, 162*c* are respectively connected with the second conductive lines 130*a*, 130*b*, 130*c* electrically through the third opening 146. In this exemplary embodiment, the cathode layers 162*a*, 162*b*, 162*c* respectively cover the first organic light emitting layers 152*a*, 152*b*, 152*c*, the second organic light emitting layers 154*a*, 154*b*, 154*c* and the third openings 146, and the longitudinal axis of each of the cathode layers 162*a*, 162*b*, 162*c* substantially extends along the first direction D1, for example. The cathode layers 162*a*, 162*b*, 162*c* are respectively, for example, a transparent electrode layer, for example, a metal oxide layer, such as indium tin oxide, indium zinc oxide, aluminum tin oxide, aluminum zinc oxide, indium germanium zinc oxide, or other appropriate metal oxide, or a stacked layer of the above at least two metal oxide layer s, or other thin metal layers having high light transmittance or other thin metal stacked layer. According to other exemplary embodiments, the cathode layers 162*a*, 162*b*, 162*c* could be, respectively, an opaque layer.

As shown in FIG. 1D, the first light emitting unit 110*a* and a second light emitting unit 110*b*, for example, are neighbor to each other and are substantially arranged along the second direction D2. The anode layer 120*b* of the second light emitting unit 110b is electrically connected with the second conductive line 130a, and the second conductive line 130a is electrically connected with the cathode layer 162a of the first light emitting unit 110a. Accordingly, the anode electrode layer 120b of the second light emitting unit 110b and the cathode layer 162a of the first light emitting unit 110a are electrically connected such that the first light emitting unit 110a and the second light emitting unit 110b are electrically connected in series along the second direction D2. In this exemplary embodiment, the first conductive line 126b of the second light emitting unit 110b and the second conductive line 130a of the first light emitting unit 110a, for example, are electrically connected and the first conductive line 126b of the second light emitting unit 110b and the second conductive line 130a of the first light emitting unit 110a are structurally connected. Although certain illustrated embodiments herein refers to the first light emitting unit 110a and the second light emitting unit 110b, it is to be understood that a plurality of light emitting units of a same row arranged along the second direction D2 may also comprise the characteristics described above. In other words, the first conductive line 126b of the $n^{th}$ light emitting unit (such as, a second light emitting unit 110b) is electrically connected with the second conductive line 130a of the $n-1^{th}$ light emitting unit (such as the first light emitting unit 110a) so that they are connected in series along the second direction D2.

In this exemplary embodiment, the first organic light emitting layer 152a of the first light emitting unit 110a and the first organic light emitting layer 152b of the second light emitting unit 110b, for example, are structurally connected to form the first patterned organic light emitting layer 250a. Alternatively speaking, there is a gap 123 (referring to FIG. 1B) between the first sub-electrode 122a of the first light emitting unit 110a and the first sub-electrode 122b of the second light emitting unit 110b, and the first patterned light emitting layer 250a, for example, covers the first sub-electrode 122a of the first light emitting unit 110a, the first sub-electrode 122b of the second light emitting unit 110b, and the gap 123. In this exemplary embodiment, the first patterned organic light emitting layer 250a is substantially a strip layer, having a longitudinal axis substantially extending along the second direction D2. Although in certain illustrated embodiments above, the first patterned organic light emitting layer 250a herein refers to the first organic light emitting layers 152a, 152b of two neighboring light emitting units 110a, 110b configured along the second direction D2 (in other words, the first organic light emitting layer 250a covers the first sub-electrode 122a, 122b of two neighboring light emitting units 110a, 110b), it is to be understood that in other exemplary embodiments, the first patterned organic light emitting layer 250a may also extend along the second direction D2 to cover not only the first sub-electrode 122a, 122b but more first sub-electrodes (not shown) arranged in the same row.

Similarly, the second organic light emitting layer 154a of the first light emitting unit 110a and the first organic light emitting layer 154b of the second light emitting unit 110b, for example, are structurally connected to form the second patterned organic light emitting layer 250b. More specifically, there is a gap 123 between the second sub-electrode 124a of the first light emitting unit 110a and the second sub-electrode 124b of the second light emitting unit 110b, and the second patterned light emitting layer 250b, for example, covers the second sub-electrode 124a of the first light emitting unit 110a, the second sub-electrode 124b of the second light emitting unit 110b, and the gap 123. In this exemplary embodiment, the second patterned organic light emitting layer 250b is substantially a strip layer, having a longitudinal axis substantially extending along the second direction D2. Although in certain illustrated embodiments above, the second patterned organic light emitting layer 250b herein refers to the second organic light emitting layers 154a, 154b of two neighboring light emitting units 110a, 110b configured along the second direction D2 (in other words, the second organic light emitting layer 250b covers the second sub-electrodes 124a, 124b of two neighboring light emitting units 110a, 110b), it is to be understood that in other exemplary embodiments, the second patterned organic light emitting layer 250b may also extend along the second direction D2 to cover not only the second sub-electrodes 124a, 124b but more second sub-electrodes (not shown) arranged in the same row.

Additionally, the first light emitting unit 110a and the third light emitting unit 110c, for example, are actually neighboring to each other and are a substantially arranged along the first direction D1. In this exemplary embodiment, the cathode layer 162c of the third light emitting unit 110c is electrically connected with the cathode layer 162a of the first light emitting unit 110a such that the first light emitting unit 110a and the third light emitting unit 110c are coupled in parallel along the first direction D1. The cathode layer 162a of the first light emitting unit 110a and the cathode layer 162c of the third light emitting unit 110c are structurally connected to form the patterned cathode layer 260a. More specifically, there is a gap (not shown) between the second organic light emitting layer 154a of the first light emitting unit 110a and the first organic light emitting layer 152c of the third light emitting unit 110c, and the patterned cathode layer 260a, for example, covers the first organic light emitting layer 152a and the second light emitting layer 154a of the first light emitting unit 110a, the first organic light emitting layer 152c and the second organic light emitting layer 154c of the third light emitting unit 110c, and the gap. In this exemplary embodiment, the patterned electrode layer 260a, for example, is substantially a strip layer, having a longitudinal axis substantially extending along the first direction D1. In this exemplary embodiment, each patterned cathode layer 260a crosses over a plurality of patterned light emitting layers 250a, 250b. Although the patterned cathode layer 260a of the above certain illustrated embodiments herein refers to the cathode layers 162a, 162c of two neighboring light emitting units 110a, 110c configured along the first direction D1 (in other words, the patterned cathode layer 260a covers the light emitting layers 152a, 152c, 154a, 154c of two neighboring light emitting units 110a, 110c), it is to be understood that in other exemplary embodiments, the patterned cathode layer 260a may also extend along the first direction D1 to cover not only the plurality of light emitting layers 152a, 152c, 154a, 154c but more light emitting layers (not shown) arranged in the same row. Furthermore, since the patterned cathode layer 260b is similar to the patterned cathode layer 260a, a detail description of the patterned cathode layer 260b is omitted.

Figure 3A:
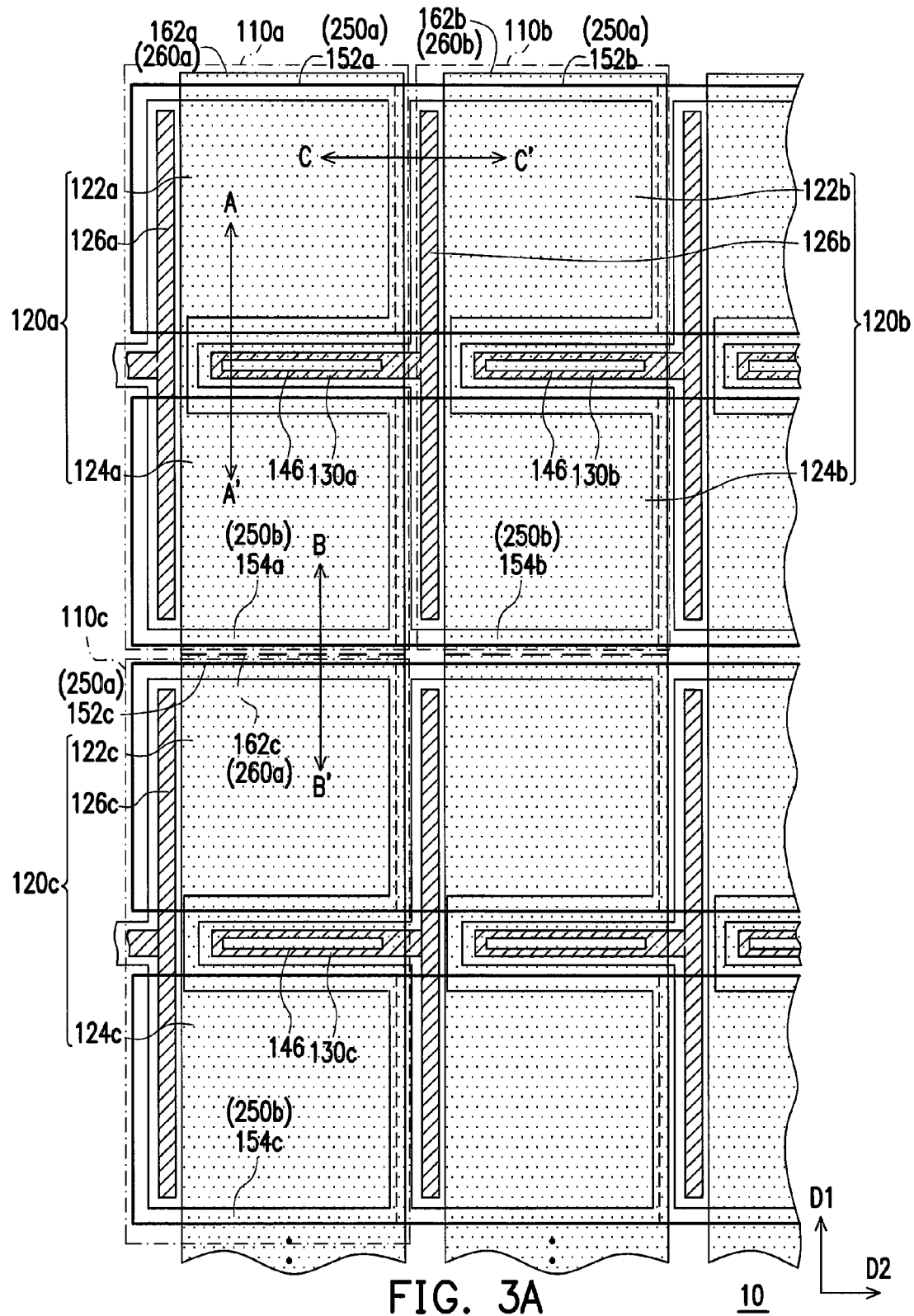
FIG. 3A is a schematic top view diagram of an organic light emitting device according to an exemplary embodiment of the invention.
Figure 3B:
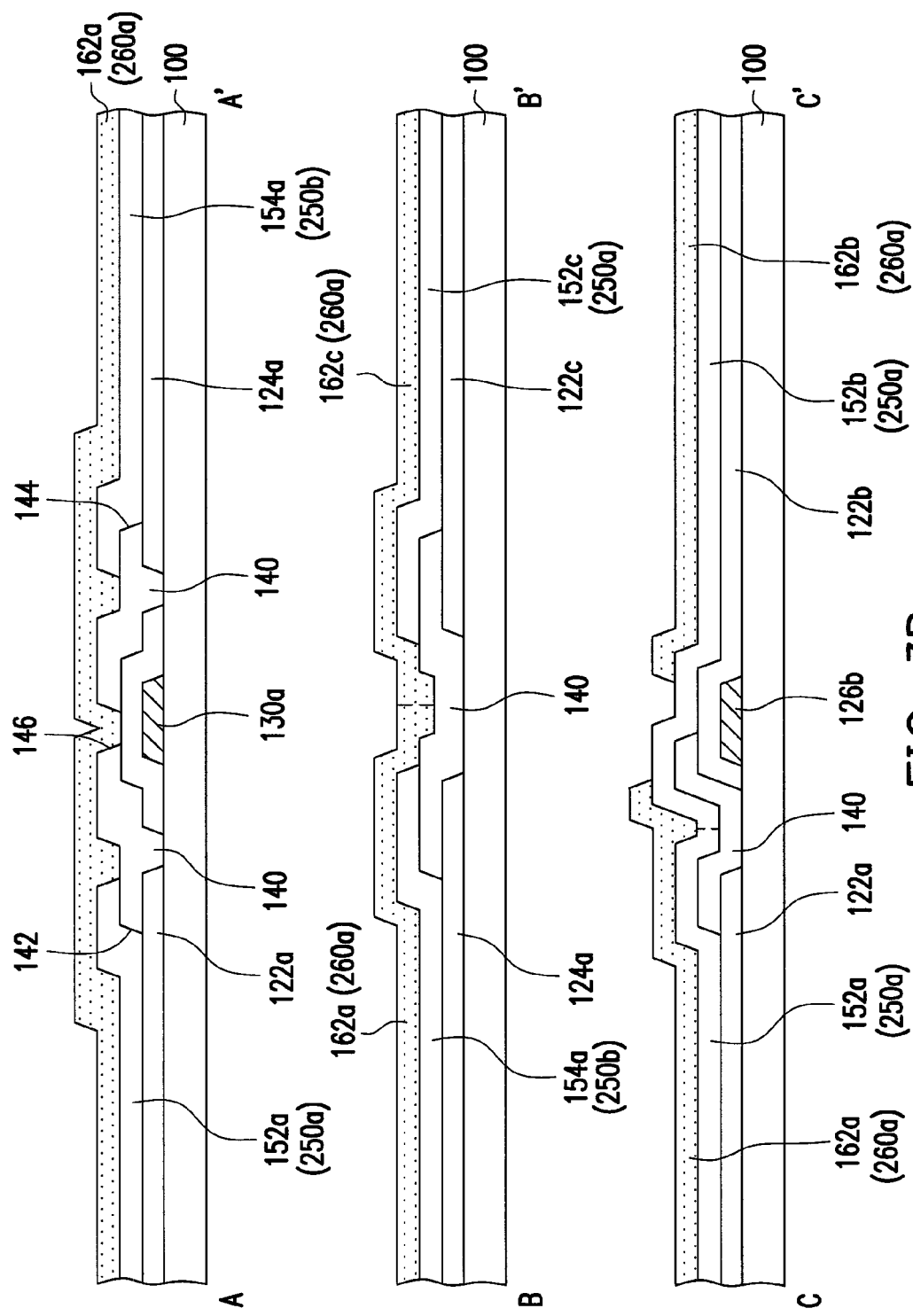
FIG. 3B is a cross-sectional diagram of FIG. 3A along the cutting lines A-A', B-B', C-C'.
Figure 4:
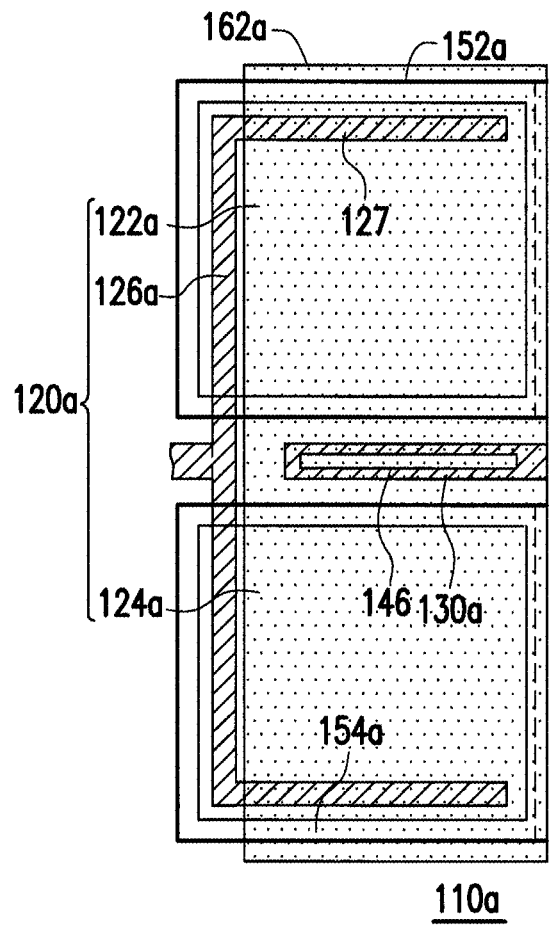
FIG. 4 is a partial top view diagram of an organic light emitting device according to an exemplary embodiment of the invention.
Figure 5:
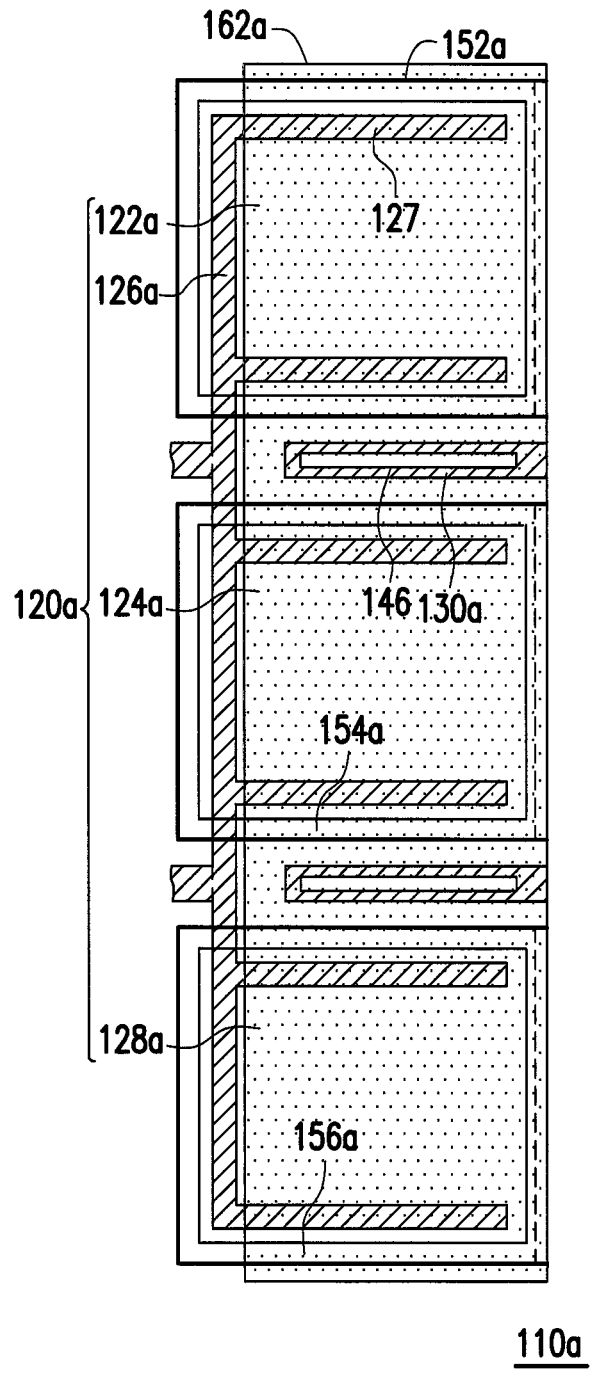
FIG. 5 is a partial top view diagram of an organic light emitting device according to an exemplary embodiment of the invention.

It is worthy to note that the certain illustrated embodiments herein refers to the second and the third light emitting units 110b, 110c having substantially the same structures as that of the first light emitting unit 110a, it should be appreciated that in other exemplary embodiments, the structures of the second and the third light emitting units 110b, 110c could be different from that of the first light emitting unit 110a. In yet another exemplary embodiments, as shown in FIGS. 3A and 3B, the first sub-electrode 122a and the second sub-electrode 124a are connected and cover the first conductive line 126a and the second conductive line (not labeled) connected with the first conductive line 126a, the first sub-electrode 122b and the second sub-electrode 124b are connected and cover the first conductive line 126b and the second conductive line 130a connected with the first conductive line 126*b*, and the first sub-electrode 122*c* and the second sub-electrode 124*c* are connected and cover the first conductive line 126*c* and the second conductive line 130*b* connected with the first conductive line 126*c*. Moreover, in this exemplary embodiment, the first conductive lines 126*a*, 126*b*, 126*c* respectively being a strip conductor as shown in FIG. 1A is used as an example, the first conductive lines 126*a* 126*b*, 126*c* could be in other shapes. For example, as shown in FIG. 4, the first conductive line 126*a* in this exemplary embodiment may include a plurality of branch conductive lines 127 to increase the electrical connection between the first conductive line 126*a* and the first and second sub-electrodes 122*a*, 124*a*. Although, in this exemplary embodiment, the branch conductive lines 127 are disposed at the boarders of the first sub-electrode 122*a* and the second sub-electrode 124*a*, and the branch conductive lines 127 are respectively disposed corresponding to one of the first sub-electrode 122*a* and the second sub-electrodes 124*a*, the branch conductive lines 127 may be disposed at the center or other positions of the first sub-electrode 122*a* and the second sub-electrode 124*a*. Further, more branch conductive lines 127 may be disposed corresponding to each of the first sub-electrode 122*a* and the second sub-electrodes 124*a* (as shown in FIG. 5). Additionally, although the light emitting unit in the above exemplary embodiments includes two sub-electrodes, it should be appreciated that these exemplary embodiments are not intended to restrict the scope of this invention. In other exemplary embodiments, as shown in FIG. 5, the anode layer 120*a* of the light emitting unit 110*a* may include a plurality of sub-electrodes 122*a*, 124*a*, 128*a*, and these sub-electrodes 122*a*, 124*a*, 128*a* are electrically connected via the first conductive line 126*a* and are disposed with a second conductive line 130*a* therebetween. The second conductive line 130*a* is electrically connected with the first conductive line of the neighboring light emitting unit (not shown) to electrically connect the cathode layer 162*a* of the light emitting unit 110*a* with the anode layer of the light emitting unit. Further, the sub-electrodes 122*a*, 124*a*, 128*a* are respectively disposed with a light emitting layer 152*a*, 154*a* and 156*a*, and a cathode layer 162*a*.

In the exemplary embodiment of the disclosure, since the patterned light emitting layer and the patterned cathode layer are formed crossing over each other (for example, to vertically intersect), during the fabrication of the light emitting device, the alignment process of the mask used in forming the patterned light emitting layer and of the mask used in forming the patterned cathode layer could be simplified. Hence, the overall fabrication method of the light emitting device is less complicated and the fabrication time is reduced.

The method of disposing the light emitting units according to the exemplary embodiments of the disclosure allows the light emitting units to be connected in series along the second direction, and allows the serially connected light emitting units to be connected in parallel along the first direction. Accordingly, the light emitting device is provided with a uniform brightness. Based on the exemplary embodiments in the disclosure, the second conductive line disposed in the gap between two separated sub-electrodes is used to connect the cathode and the anode of two neighboring light emitting units. Hence, the areas of the non-light emitting region created for the conductive lines used in bridging two neighboring light emitting units can be substantially decreased, and the visibility of the non-light emitting region between the light emitting units could be significantly reduced. Ultimately, the aperture ratio of the light emitting device is improved.

In the light emitting device of the exemplary embodiment of the disclosure, the disposition of the first conductive lines and the second conductive lines of the light emitting units allows a plurality of light emitting units to be connected in series along the second direction and the serially connected light emitting units to be connected in parallel along the first direction. Accordingly, the light emitting device is provided with a uniform brightness. Additionally, since the second conductive line disposed between two separated sub-electrodes is used for connecting the cathode and the anode of two neighboring light emitting units, the area of the non-light emitting region created for the conductive lines used in bridging two neighboring light emitting units is substantially reduced, and the visibility of the non-light emitting region between the light emitting units is significant reduced. As a result, the aperture ratio of the light emitting device is improved. Moreover, according to the fabrication method of a light emitting device of the exemplary embodiments, the patterned light emitting layer and the patterned cathode layer cross over each other. Hence, the alignment process of the mask used in forming the patterned light emitting layer and of the mask used in forming the patterned cathode layer could be simplified. Therefore, the overall fabrication method of the light emitting device is less complicated and the fabrication time is reduce.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An organic light emitting device, comprising:
   a substrate;
   a first light emitting unit, comprising:
      a first anode layer, disposed on the substrate and comprising a first sub-electrode, a second sub-electrode, and a first conductive line connecting the first sub-electrode and the second sub-electrode, wherein the first sub-electrode and the second sub-electrode are substantially arranged along a first direction;
      a second conductive line, disposed on the substrate between the first sub-electrode and the second sub-electrode;
      a first insulation layer, disposed on the first sub-electrode, the second sub-electrode and the second conductive line, and the first insulation layer comprising a first opening, a second opening, and a third opening, respectively exposing the first sub-electrode, the second sub-electrode and the second conductive line;
      a first organic light emitting layer, disposed in the first opening;
      a second organic light emitting layer, disposed in the second opening; and
      a first cathode layer, disposed on the first organic light emitting layer and the second organic light emitting layer, and filling the third opening along the first direction; and
   a second light emitting unit, the second light emitting unit and the first light emitting unit substantially arranged along a second direction, wherein the second light emitting unit comprises a second anode layer disposed on the substrate and a third conductive line physically connecting the second anode layer and the second conductive line respectively, such that the second anode layer of the second light emitting unit is electrically connected with the first cathode layer of the first light emitting unit through the third conductive line and the second conductive line to couple the first light emitting unit and the second light emitting unit in series along the second direction.

2. The organic light emitting device of claim 1, wherein the longitudinal axis of the first cathode layer substantially extends along the first direction.

3. The organic light emitting device of claim 1, wherein the first sub-electrode and the second sub-electrode are constituted with a same material.

4. The organic light emitting device of claim 1, wherein the first conductive line and the second conductive line are constituted with a same material.

5. The organic light emitting device of claim 1, wherein the second cathode layer comprises a third-sub-electrode, a fourth sub-electrode, and a third conductive line connecting the third sub-electrode and the fourth sub-electrode, and the third sub-electrode and the fourth sub-electrode are substantially arranged along the first direction.

6. The organic light emitting device of claim 5, wherein the second conductive line and the third conductive line are electrically connected.

7. The organic light emitting device of claim 5, wherein the second light emitting unit further comprises:
 a fourth conductive line, disposed on the substrate between the third sub-electrode and the fourth sub-electrode;
 a second insulation layer, disposed on the third sub-electrode, the fourth sub-electrode, and the fourth conductive line, and the second insulation layer comprising a fourth opening, a fifth opening and a sixth opening respectively exposing the third sub-electrode, the fourth sub-electrode, and the fourth conductive line;
 a third organic light emitting layer, disposed in the fourth opening;
 a fourth organic light emitting layer, disposed in the fifth opening; and
 a second cathode layer, disposed on the third organic light emitting layer and the fourth organic light emitting layer, and filling the sixth opening, wherein the second cathode layer is electrically connected with the fourth conductive layer through the sixth opening.

8. The organic light emitting device of claim 7, wherein there is a gap between the first sub-electrode and the third sub-electrode, the first organic light emitting layer and the third organic light emitting layer are structurally connected and cover the first sub-electrode, the third sub-electrode and the gap, and the first organic light emitting layer and the third organic light emitting layer are substantially configured along the second direction.

9. The organic light emitting device of claim 7, wherein there is a gap between the second sub-electrode and the fourth sub-electrode, the second organic light emitting layer and the fourth organic light emitting layer are structurally connected and cover the second sub-electrode, the fourth sub-electrode and the gap, and the second organic light emitting layer and the fourth organic light emitting layer are substantially configured along the second direction.

10. The organic light emitting device of claim 7, wherein the longitudinal axis of the second cathode layer substantially extends along the first direction.

11. The organic light emitting device of claim 1 further comprising a third light emitting unit, and the third light emitting unit and the first light emitting unit are substantially arranged along the first direction, wherein the third organic light emitting layer includes a third cathode layer disposed on the substrate, and the third cathode layer and the first cathode layer of the first light emitting unit are electrically connected such that the first light emitting unit and the third light emitting unit are connected in parallel along the first direction.

12. The organic light emitting device of claim 11, wherein the first cathode layer and the third cathode layer are structurally connected, and are substantially configured along the first direction.

13. A manufacturing method of an organic light emitting device, the method comprising:
 forming a first patterned conductive layer on a substrate, the first patterned conductive layer comprising a first conductive line, a second conductive line, a third conductive line and a fourth conductive line, wherein the second conductive line and the third conductive line are electrically and physically connected;
 forming a second patterned conductive layer on the substrate, the second patterned conductive layer comprising a first sub-electrode, a second sub-electrode, a third sub-electrode and a fourth sub-electrode, wherein the first sub-electrode and the second sub-electrode are substantially arranged along a first direction, the third sub-electrode and the fourth sub-electrode are substantially arranged along the first direction, the first sub-electrode and the third sub-electrode are substantially arranged along a second direction and a first gap is formed between the first sub-electrode and the third sub-electrode, and the second sub-electrode and the fourth sub-electrode are substantially arranged along the second direction and a second gap is formed between the first sub-electrode and the third sub-electrode, and the first conductive line electrically connects the first sub-electrode and the second sub-electrode, the second conductive line is disposed between the first sub-electrode and the second sub-electrode, the third conductive line electrically connects the third sub-electrode and the fourth sub-electrode, and the fourth conductive line is disposed between the third sub-electrode and the fourth sub-electrode, wherein the first sub-electrode, the second sub-electrode and the first conductive line form a first anode layer, and the third sub-electrode, the fourth sub-electrode and the third conductive line form a second anode layer;
 forming an insulation layer on the substrate, the insulation layer comprising a first opening, a second opening and a third opening, respectively exposing the first sub-electrode, a second sub-electrode and the second conductive line, and the insulation layer comprising a fourth opening, a fifth opening and a sixth opening, respectively exposing the third sub-electrode, the fourth sub-electrode and the fourth conductive line;
 forming a first patterned organic light emitting layer and a second patterned organic light emitting layer on the insulation layer, wherein the first patterned organic light emitting layer fills the first opening and the fourth opening, the first patterned organic light emitting layer continuously covers the first sub-electrode, the first gap and the third sub-electrode, the second patterned organic light emitting layer fills the second opening and the fifth opening, and the second patterned organic light emitting layer continuously covers the second sub-electrode, the second gap and the fourth sub-electrode; and
 forming a first patterned cathode layer and a second patterned cathode layer on the first patterned organic light emitting layer and the second patterned organic light emitting layer, wherein the first patterned cathode layer is continuously extended along the first direction and continuously disposed on the first sub-electrode and the second sub-electrode, and fills the third opening, and the second patterned cathode layer is continuously extended along the first direction and continuously disposed on the third sub-electrode and the fourth sub-electrode, and fills the sixth opening, wherein the first patterned cathode layer is electrically connected with the second conductive line through the third opening, and the second patterned cathode layer is electrically connected with the fourth conductive line through the sixth opening, the first patterned cathode layer continuously covers the first patterned organic light emitting layer on the first sub-electrode, the second patterned organic light emitting layer on the second sub-electrode and a space between the first patterned organic light emitting layer and the second patterned organic light emitting layer, and the second patterned cathode layer continuously covers the first patterned organic light emitting layer on the third sub-electrode, the second patterned organic light emitting layer on the fourth sub-electrode and a space between the first patterned organic light emitting layer and the second patterned organic light emitting layer.

14. The manufacturing method of claim 13, wherein the longitudinal axis of the first patterned organic light emitting layer and the longitudinal axis of the second patterned organic light emitting layer substantially extend along the second direction, and the first patterned organic light emitting layer and the second organic light emitting layer are substantially arranged along the first direction.

15. The manufacturing method of claim 13, wherein the longitudinal axis of the first patterned cathode layer and the longitudinal axis of the second patterned cathode layer substantially extend along the first direction, and the first patterned cathode layer and the second patterned cathode layer are substantially arranged along the second direction, and the first patterned cathode layer crosses over the first patterned organic light emitting layer and the second patterned organic light emitting layer, and the second patterned cathode layer crosses over the first patterned organic light emitting layer and the second patterned organic light emitting layer.

\* \* \* \* \*